United States Patent [19]
Masuda

[11] Patent Number: 5,737,033
[45] Date of Patent: Apr. 7, 1998

[54] AGC APPARATUS CONCURRENTLY SATISFYING SUFFICIENT IMPEDANCE MATCHING CHARACTERISTIC AND LINEAR AGC CHARACTERISTIC

[75] Inventor: Sigeto Masuda, Osaka, Japan

[73] Assignee: Sharp Kabushiki Kaisha, Osaka, Japan

[21] Appl. No.: 550,538

[22] Filed: Oct. 30, 1995

[30] Foreign Application Priority Data

Sep. 27, 1995 [JP] Japan .................................. 7-249424

[51] Int. Cl.$^6$ .................................................. H04N 5/52
[52] U.S. Cl. .......................... 348/678; 348/255; 348/685; 455/234.1; 455/240.1; 330/129
[58] Field of Search .................... 455/234.1, 240.1; 348/678, 685, 255; 330/9, 59, 129, 136, 284; H04N 5/52

[56] References Cited

U.S. PATENT DOCUMENTS

| | | | |
|---|---|---|---|
| 4,517,526 | 5/1985 | Di Cicco | 330/284 |
| 4,546,326 | 10/1985 | Van Uffelen et al. | 330/129 |
| 4,591,796 | 5/1986 | Muller-Girard et al. | 328/184 |
| 4,799,106 | 1/1989 | Moore et al. | 358/168 |
| 4,970,594 | 11/1990 | Kitaura et al. | 358/172 |
| 4,989,074 | 1/1991 | Matsumoto | 358/21 R |
| 5,089,890 | 2/1992 | Takayama | 358/164 |
| 5,194,822 | 3/1993 | Bureau et al. | 330/129 |

FOREIGN PATENT DOCUMENTS

| | | | |
|---|---|---|---|
| 3216707 | 2/1984 | Germany . | |
| 2846207 | 8/1993 | Germany . | |
| 63-187735 | 3/1988 | Japan . | |
| 6061899 | 4/1994 | Japan | H04B 7/212 |

*Primary Examiner*—Glenton B. Burgess

[57] ABSTRACT

An inexpensive AGC apparatus capable of concurrently satisfying a sufficient impedance matching characteristic and a linear AGC characteristic is provided. The AGC apparatus is provided with a linear correction circuit. The linear correction circuit corrects a control voltage from a control voltage generator circuit, and outputs a corrected control voltage to a variable gain amplifier circuit. The above-mentioned correction is such a correction that a variation of a decibel value of an AGC gain relative to a variation of the control voltage is linearized.

19 Claims, 13 Drawing Sheets x : Uncorrected AGC voltage
W : Corrected AGC voltage

AGC APPARATUS CONCURRENTLY SATISFYING SUFFICIENT IMPEDANCE MATCHING CHARACTERISTIC AND LINEAR AGC CHARACTERISTIC

BACKGROUND OF THE INVENTION

1. Field of the Invention

The present invention relates to an AGC (Automatic Gain Control) apparatus ready for digital processing, and relates, for example, to an AGC apparatus constituting part of an electronic tuner of a CATV (Cable Television) for processing a digital signal.

2. Description of the Background Art

Conventionally, as an AGC apparatus of the above-mentioned type, there has been an AGC apparatus of a CATV tuner 100 as shown in FIG. 15. The tuner 100 has a tuner main unit 10 and a demodulator unit 11. The AGC apparatus is comprised of a variable gain amplifier circuit 2 of the tuner main unit 10, and a control voltage generator circuit 7, a D/A converter 8, a level detector circuit 9, an A/D converter 3 and a digital demodulator circuit 4 of the demodulator unit 11.

The tuner main unit 10 includes a band-pass filter BF1 connected to a tuner input terminal 1, the variable gain amplifier circuit 2, an amplifier AMP1, a mixer MXR1, a band-pass filter BF2, an amplifier AMP2 and a local oscillator LO. The demodulator unit 11 includes a band-pass filter BF3, the A/D converter 3, the digital demodulator circuit 4, the level detector circuit 9, the D/A converter 8 and the control voltage generator circuit 7.

A signal inputted to the demodulator unit 11 is quantized by the A/D converter 3. Assuming that the A/D converter 3 has a resolution of 10 bits, the input signal to the digital demodulator circuit 4 has a level of an integer value of 0 to 1023. Assuming herein that the level of the signal inputted to the digital demodulator circuit 4 is not greater than 255, any level in the range of 256 to 1023 among the possible levels of the input signal is an excessive input. Therefore, the variable gain amplifier circuit 2 of the tuner main unit 10 is required to reduce its gain for the input signal by a maximum of $20\log(1023/255) \approx 12$ (dB).

The level detector circuit 9 decides whether or not the input signal level is at a level at which an AGC is required to be effected, decides the degree of reduction in level of the input signal, and outputs a control voltage data corresponding to a required level attenuation value. Then, the D/A converter 8 converts the control voltage data into an analog signal, and outputs the analog signal to the control voltage generator circuit 7. The control voltage generator circuit 7 operates as a voltage buffer or a current buffer to convert the control voltage data, which has been converted into the analog signal, into an AGC signal $v_1$ which can drive the variable gain amplifier circuit 2.

The AGC signal $v_1$ which is as an analog control signal outputted from the control voltage generator circuit 7 is directly inputted to the variable gain amplifier circuit 2 of the tuner main unit 10. Then, the variable gain amplifier circuit 2 controls a tuner gain based on the AGC signal $v_1$.

FIG. 16 shows a construction of the variable gain amplifier circuit 2. Three diodes $D_1$, $D_2$ and $D_3$ provided in the variable gain amplifier circuit 2 are PIN diodes of which high-frequency resistance rd can be varied by varying its forward current $I_F$ in a manner as shown in FIG. 18.

When an AGC voltage $v_2$ is now set to a maximum value within a range in which the AGC voltage can be varied, a current flows through a path including the diode $D_1$ and a resistor $R_5$ via a high-frequency cut-off coil L. In the present case, a voltage $v_4$ at a connection point "a" is a voltage achieved by dividing a power voltage B by a resistor $R_3$ and a resistor $R_4$. The voltage $v_4$ at the connection point "a" is set to a value lower than a voltage $v_3$ at a connection point "c" when the maximum AGC voltage $v_2$ is applied to a connection point 16.

Therefore, when the AGC voltage has the maximum value, the diodes $D_2$ and $D_3$ are reversely biased by the voltage $v_3$ at the connection point "c", and therefore no current flows through the diodes $D_2$ and $D_3$. Therefore, in the above stage, an input/output characteristic (signal pass characteristic of a path extending from a terminal 14 to a terminal 15) of the variable gain amplifier circuit 2 effects only attenuation achieved by a high-frequency resistance $R_1$ of the diode $D_1$, consequently yielding the maximum gain (max gain).

When the AGC voltage $v_2$ is lowered, the current flowing through the diode $D_1$ reduces, and the voltage $v_3$ at the connection point "c" is lowered. With the above-mentioned operation, a current flowing through the diodes $D_2$ and $D_3$ increases. That is, according to the variable gain amplifier circuit 2 shown in FIG. 16, there can be obtained an AGC characteristic such that the tuner main unit 10 has the maximum gain when the AGC voltage $v_2$ is maximized and the gain is reduced when the AGC voltage $v_2$ is lowered.

FIG. 17 shows a high-frequency equivalent circuit of the variable gain amplifier circuit 2 shown in FIG. 16. In FIG. 17, the resistors $R_1$, $R_2$ and $R_3$ are high-frequency resistance components of the diodes $D_1$, $D_2$ and $D_3$. Meanwhile, a resistance $R_L$ is an impedance of a circuit in a stage subsequent to the variable gain amplifier circuit 2. The above-mentioned circuit in the subsequent stage includes the amplifier AMP1, the mixer MXR1, the local oscillator LO and so forth.

In the equivalent circuit shown in FIG. 17, an input impedance Zin viewed from the terminal 14 of the variable gain amplifier circuit 2 to the subsequent stage is expressed by the following Equation (1):

$$Zin=[\{R_1+R_LR_2/(R_L+R_2)\} \cdot R_2]/[\{R_1+R_LR_2/(R_L+R_2)\}+R_2] \quad (1)$$

In a CATV tuner, the above-mentioned input impedance Zin is important. This is because a reflection occurs at the input terminal 14 of the variable gain amplifier circuit 2 when no impedance matching is achieved. In such a case, the reflection possibly influences the other system. Particularly in a CATV tuner which is a digital system, a multipath (multiplex propagation) due to the reflection takes place to generate a phase difference in the signal, possibly hindering correct demodulation of data.

Therefore, even when an AGC is effected by the variable gain amplifier circuit 2 to control the tuner gain, the input impedance Zin expressed by Equation (1) must be matched with the impedance of the system. In the present case, $R_1$, $R_2$ and $R_3$ of Equation (1) are high-frequency resistance components of the diodes $D_1$, $D_2$ and $D_3$. The resistance values of the high-frequency resistance are functions of the direct currents flowing through the diodes $D_1$, $D_2$ and $D_3$. The direct currents flowing through the diodes $D_1$, $D_2$ and $D_3$ are varied by varying the AGC voltage $v_2$.

That is, assuming that the current flowing through the diode $D_1$ of the variable gain amplifier circuit 2 is $I_1$ and the current flowing through the diodes $D_2$ and $D_3$ is $I_2$ in FIG. 16, the currents $I_1$ and $I_2$ are expressed by the following Equations (2) and (3). It is to be noted that the diodes $D_2$ and $D_3$ have the same characteristics, and it is assumed that their saturation current is $I_{S2}$ and a saturation current of the diode $D_1$ is $I_{S1}$.

$$I_1 = I_{S1}[exp\{q(v_2-v_3)/kT\}-1] \quad (2)$$

$$I_2 = I_{S2}[exp\{q(v_4-v_3)/2kT\}-1] \quad (3)$$

In regard to denotation of symbols in Equations (2) and (3), q represents an electric charge amount of electrons, $I_S$ represents a saturation current, k represents Boltzmann's constant, and T represents an absolute temperature.

Therefore, as described above, the input impedance Zin of the variable gain amplifier circuit 2 shown in FIG. 16 is a function of the diode currents $I_1$ and $I_2$ expressed by Equations (2) and (3). Further, the input impedance Zin depends on a forward current to high-frequency resistance characteristic of the PIN diodes used as the diodes $D_1$, $D_2$ and $D_3$. As shown in FIG. 18, the high-frequency resistance rd of each PIN diode is expressed as a function approximately linear to a logarithm of the forward current $I_F$ in a middle region of $I_F$, however, it exhibits a saturation characteristic in an infinitesimal current region and a great current region.

When the diode currents $I_1$ and $I_2$ are set so that the input impedance Zin expressed by Equation (1) matches a system impedance Zs even in a state in, which an AGC is effected, including the state of maximum gain, according to the conditions including Equations (1), (2) and (3), the AGC characteristic, i.e., the AGC gain, or the logarithmic value of an attenuation value relative to a variation of the AGC voltage varies disadvantageously as expressed by a curved line in FIG. 2.

In the case of a digital system as shown in FIG. 15, the output signal is converted from an analog signal into a digital signal by the A/D converter 3 of the demodulator unit 11, and then demodulated in a digital form by the digital demodulator circuit 4. At the same time, the level of the digital signal inputted to the digital demodulator circuit 4 is detected by the level detector circuit 9, while the control voltage generator circuit 7 generates the AGC voltage $v_1$ so that the level of the digital signal inputted to the digital demodulator circuit 4 comes to have a specified level. Then, by feeding back the AGC voltage $v_1$ as a feedback signal to the variable gain amplifier circuit 2 of the tuner main unit 10, the gain of the tuner is controlled. Thus the variable gain amplifier circuit 2, digital demodulator circuit 4, level detector circuit 9 and control voltage generator circuit 7 constitute an AGC loop. In the AGC loop, when the variable gain amplifier circuit 2 of the tuner main unit 10 has an AGC characteristic which varies in a curved line as shown in FIG. 2, the resolution of the D/A converter 8 must be increased for the purpose of obtaining required system characteristics. The above-mentioned arrangement disadvantageously causes cost increase.

The resolution of the D/A converter 8 will be described concretely below. For instance, it is assumed that an AGC is effected in steps of 1 dB and an AGC voltage x in this case has a range of 0 to 10 V. In the above-mentioned case, according to the AGC characteristic that varies in a curved line as shown in FIG. 2, an AGC sensitivity varies from 0.025 V/1 dB up to 2.0 V/1 dB. Therefore, in order to control the gain in steps of 1 dB even when the AGC sensitivity is in a region of 0.025 V/1 dB, the AGC voltage x must be varied in steps of 0.025 V. Therefore, the D/A converter 8 must achieve an output signal resolution of (10/0.025)+1= 401 steps. That is, the D/A converter 8 is required to have a resolution of nine bits. In contrast to the above, when the AGC sensitivity has a constant value at 0.1 V/dB, the AGC voltage is required to be varied in steps of 0.1 V even when the gain is varied in steps of 1 dB. Therefore, the D/A converter 8 is required to achieve an output resolution of 10/0.1+1=101 steps. That is, the D/A converter 8 is required to have a resolution of seven bits. Thus, when the variable gain amplifier circuit 2 has an AGC characteristic that varies in a curved line, the resolution of the D/A converter 8 is required to be increased, and this causes cost increase.

SUMMARY OF THE INVENTION

An object of the present invention is therefore to provide an inexpensive AGC apparatus capable of concurrently satisfying a sufficient impedance matching characteristic and a linear AGC characteristic.

In order to achieve the aforementioned object, the present invention provides an AGC apparatus comprising:

variable gain amplification means for adjusting a gain of an analog output signal with respect to an analog input signal according to a level of an analog control signal;

signal processing means for receiving the analog output signal of the variable gain amplification means and outputting a digital signal;

D/A conversion means for receiving the digital signal outputted from the signal processing means and outputting an analog signal; and linear correction means for receiving the analog signal outputted from the D/A conversion means and outputting a corrected signal obtained by correcting the analog signal as the analog control signal to the variable gain amplification means so that a relation of the gain of the variable gain amplification means with respect to the analog signal is expressed by at least one straight line.

Therefore, according to the AGC apparatus of the present invention, the linear correction means receives the analog signal from the D/A conversion means. Then, the linear correction means outputs the corrected signal obtained by correcting the analog signal as the control signal to the variable gain amplification means. The correction is effected so that the AGC gain of the variable gain amplification means varies linearly with respect to the variation of the analog signal prior to the correction process. Then, the variable gain amplification means varies the AGC gain according to the control signal. In the above stage, the AGC gain of the variable gain amplification means varies linearly with respect to the variation of the analog signal prior to the correction process.

Thus, in the present AGC apparatus, the linear correction means outputs the corrected signal generated by correcting the analog signal outputted from the D/A conversion means as the control signal, so that the AGC characteristic of the variable gain amplifier circuit is linearized. Therefore, when the variable gain amplifier circuit is constructed so that a sufficient impedance matching can be achieved at the input terminal of the variable gain amplifier circuit, the AGC characteristic of the variable gain amplifier circuit can be linearized. Therefore, according to the present AGC apparatus, a sufficient impedance matching characteristic and a linear AGC characteristic can be concurrently satisfied.

Further, in an AGC apparatus of one embodiment, assuming that the analog signal outputted from the D/A conversion means is inputted as the control signal to the variable gain amplification means without being corrected, and that a characteristic curve representing the relation of the gain of the variable gain amplification means with respect to the control signal is expressed by two linear functions $y=f_1(x)=c_1x+d_1$ and $y=f_2(x)=c_2x+d_2$ (provided that, assuming that an x-coordinate value of an intersection of $y=f_1(x)$ and $y=f_2(x)$ is t, then $y=f_1(x)$ is used when $x \leq t$, and $y=f_2(x)$ is used when $x>t$) where x represents a voltage and y represents a gain, then the linear correction means determines a value w of equations $w=f_1^{-1}(ax+b)$ and $w=f_2^{-1}(ax+b)$ as the corrected signal using a linear function $ax+b$ of the analog signal x prior to a correction process as a variable x of inverse functions $f_1^{-1}(x)$ and $f_2^{-1}(x)$ of the equations $f_1(x)$ and $f_2(x)$.

According to the AGC apparatus of the above-mentioned embodiment, the linear correction means is required to correct the AGC voltage by the inverse function $f^{-1}$ of the linear function f, and therefore the contents of correction is simplified. Therefore, the construction of the linear correction circuit can be simplified. Therefore, both the impedance matching and the linearization of the AGC characteristic can be achieved at low cost.

Further, in an AGC apparatus of one embodiment, the variable gain amplifier circuit and the linear correction means are provided in a tuner main unit of a tuner comprised of the tuner main unit and a digital demodulator unit.

Therefore, according to the AGC apparatus of the above-mentioned embodiment, the variable gain amplification means and the linear correction means of the AGC apparatus can be each handled as an object integrated with the tuner main unit. Therefore, improved handling can be achieved in the processes of adjustment, assembling and so forth.

Further, in an AGC apparatus of one embodiment, the linear correction means comprises:

an operational amplifier on which negative feedback is effected, and the analog output signal is saturated by the operational amplifier when the analog input signal has a level greater than a specified level.

Therefore, according to the above-mentioned embodiment, the linear correction means is allowed to have a characteristic such that the AGC characteristic of the variable gain amplification means is saturated at the maximum gain taking advantage of the saturation characteristic of the operational amplifier. According to the saturation characteristic, the AGC gain can be surely maximized when the analog input signal is higher than the specified level, thereby allowing the AGC characteristic to be designed easily.

Further, in an AGC apparatus of one embodiment, the signal processing means comprises: an A/D converter which receives a signal from the variable gain amplification means and processes the signal for analog-to-digital conversion; and a digital demodulator unit which receives the digital signal from the A/D converter and processes the digital signal for digital demodulation to output a digital signal.

Therefore, according to the above-mentioned embodiment, the digital signal outputted from the A/D converter can be demodulated in a digital form in the digital modulator unit. Then, the digital signal demodulated in a digital form is converted into the analog signal by the D/A conversion means, and the analog signal is corrected by the linear correction means, so that the corrected signal can be outputted to the variable gain amplification means.

Further, in an AGC apparatus of one embodiment, the D/A conversion means comprises: a D/A converter which receives the digital signal and outputs an analog signal; and a control voltage generator circuit which outputs a control voltage signal according to the analog signal from the D/A converter, to the linear correction means.

According to the above-mentioned embodiment, the analog signal from the D/A converter is converted into a control voltage signal in the control voltage generator circuit to be outputted to the linear correction means. Therefore, the control voltage signal appropriate for the linear correction means can be outputted to the linear correction means.

Further, in an AGC apparatus of one embodiment, the variable gain amplification means comprises a plurality of PIN diodes.

Therefore, according to the above-mentioned embodiment, the linear AGC characteristic of the variable gain amplifier comprised of the PIN diodes having a non-linear relation of a forward current to a high-frequency resistance can be satisfied concurrently with impedance matching.

Further, in an AGC apparatus of one embodiment, there is provided level detection means for outputting a digital signal representing a level of the digital signal outputted from the signal processing means, to the D/A conversion means.

Therefore, according to the above-mentioned embodiment, the level of the digital signal outputted from the signal processing means is detected, and the digital data can be outputted to the D/A converter so that the level comes to have the specified value.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The present invention will be described in detail below based on its embodiments with reference to the accompanying drawings.

First Embodiment

Figure 1:
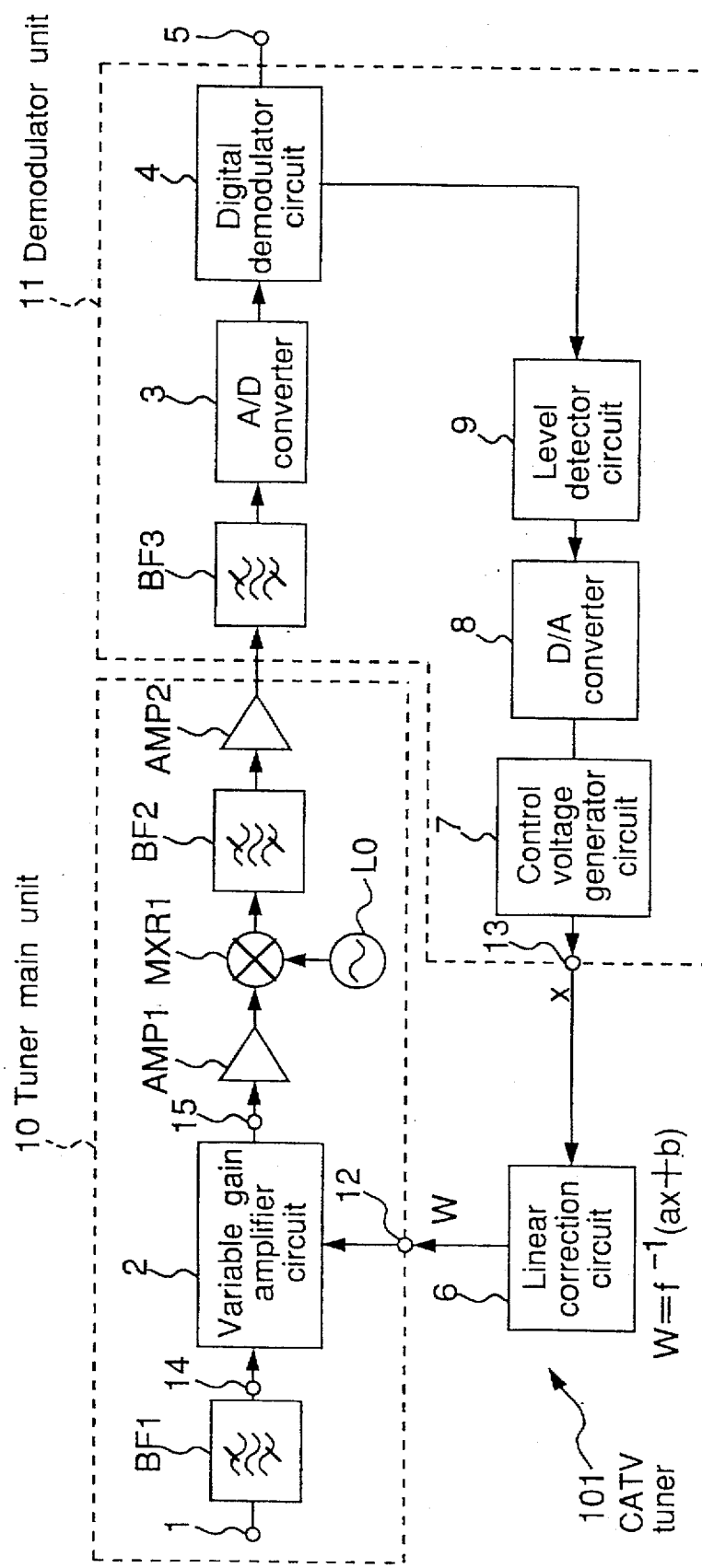
FIG. 1 is a block diagram of a CATV tuner including an AGC apparatus according to a first embodiment of the present invention.
Figure 15:
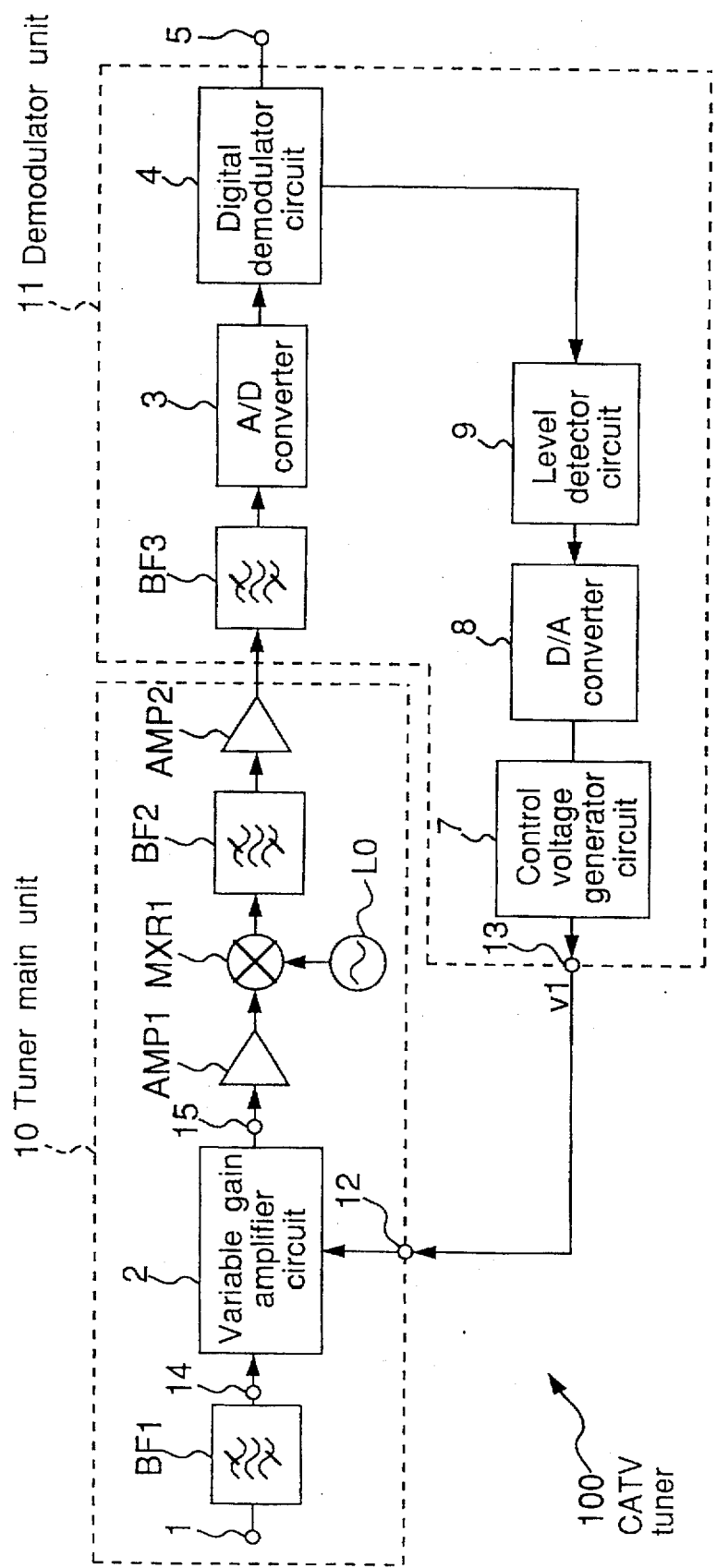
FIG. 15 is a block diagram of a CATV tuner including a conventional AGC apparatus.

FIG. 1 shows a CATV tuner 101 including an AGC apparatus according to a first embodiment of the present invention. An A/D converter 3 and a digital demodulator circuit 4 constitute signal processing means, while a control voltage generator circuit 7 and a D/A converter 8 constitute D/A conversion means. The CATV tuner 101 is implemented by connecting a linear correction circuit 6 between a control voltage input terminal 12 of the tuner unit 10 and a control voltage output terminal 13 of the demodulator unit 11 shown in FIG. 15, and therefore components having the same construction as that of the construction shown in FIG. 15 are denoted by the same reference numerals.

An AGC characteristic of the variable gain amplifier circuit 2 of the tuner unit 10 in the CATV tuner 101 is expressed by the following Equation (4), wherein w represents a control voltage inputted to the variable gain amplifier circuit 2, and y represents a logarithmic value of an attenuation value achieved by the variable gain amplifier circuit 2.

$$y = f(w) \quad (4)$$

Further, assuming that an AGC voltage outputted from the control voltage generator circuit 7 of the demodulator unit 11 is x, the following Equation (5) is required to hold in order to make the logarithmic value y of the attenuation value linearly vary with respect to a variation of the AGC voltage x. Then, Equation (5) is the intended AGC characteristic.

$$y = ax + b \quad (5)$$

where a and b are constants.

Therefore, according to Equations (4) and (5), the following Equation (6) can be obtained.

$$w = f^{-1}(ax+b) \quad (6)$$

Therefore, the linear correction circuit 6 of the AGC apparatus of the first embodiment is required to correct the AGC voltage x so as to satisfy Equation (6) to form the control voltage w. With the above-mentioned arrangement, a loop AGC characteristic can be formed into a linear characteristic having an inclination "a" and a y-intercept "b" with respect to the AGC voltage x outputted from the control voltage generator circuit 7 of the demodulator unit 11.

Figure 16:
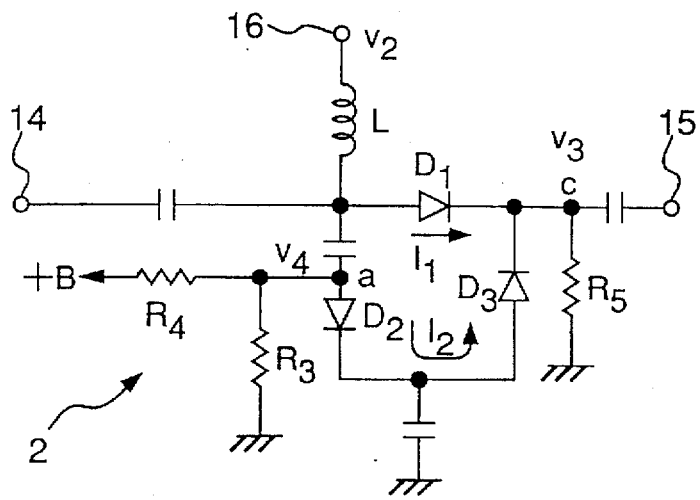
FIG. 16 shows a circuit diagram of a variable gain amplifier circuit of the conventional AGC apparatus.
Figure 17:
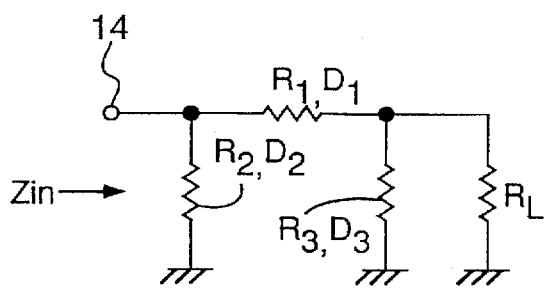
FIG. 17 is a high-frequency equivalent circuit of the variable gain amplifier circuit shown in FIG. 12.
Figure 18:
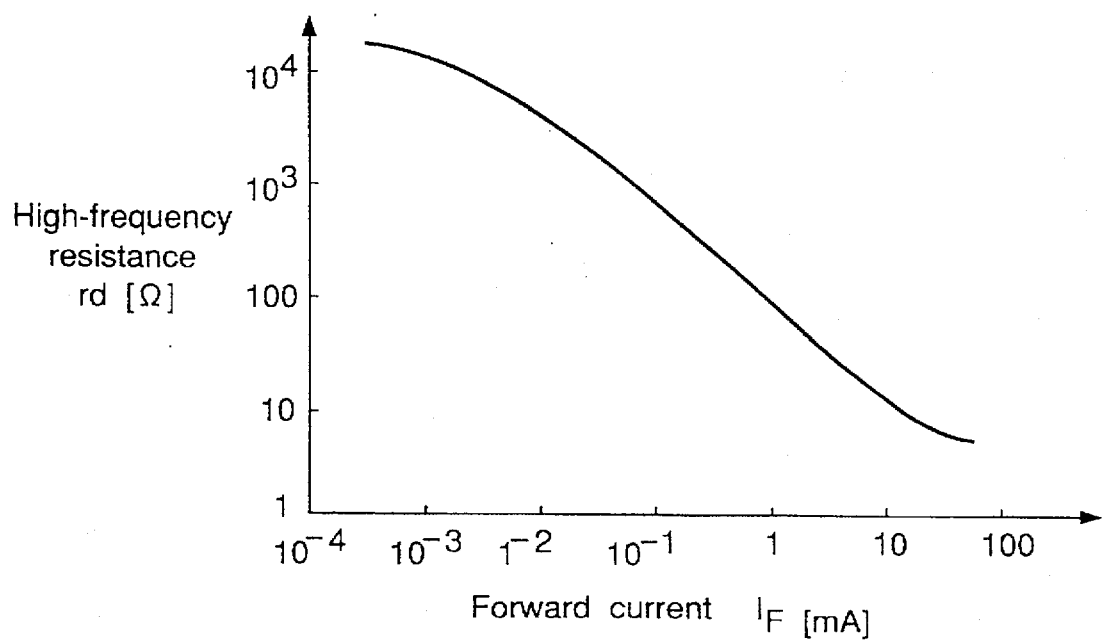
FIG. 18 is a graph of a characteristic showing a forward current to high-frequency resistance characteristic of a PIN diode.

The variable gain amplifier circuit 2 of the tuner unit 10 is a reverse AGC circuit in which the attenuation value increases when the control voltage w is lowered. The variable gain amplifier circuit 2 has the same circuit construction as that of the conventional circuit shown in FIG. 16. The AGC characteristic of the variable gain amplifier circuit 2 depends on the diode currents $I_1$ and $I_2$ and the forward currents to high-frequency resistance characteristics of the diodes $D_1$, $D_2$ and $D_3$ as expressed by Equations (2) and (3). Therefore, the function f of Equation (4) representing the AGC characteristic is very complicated. Therefore, the function $f^{-1}$ satisfying Equation (6) is very complicated.

Figure 2:
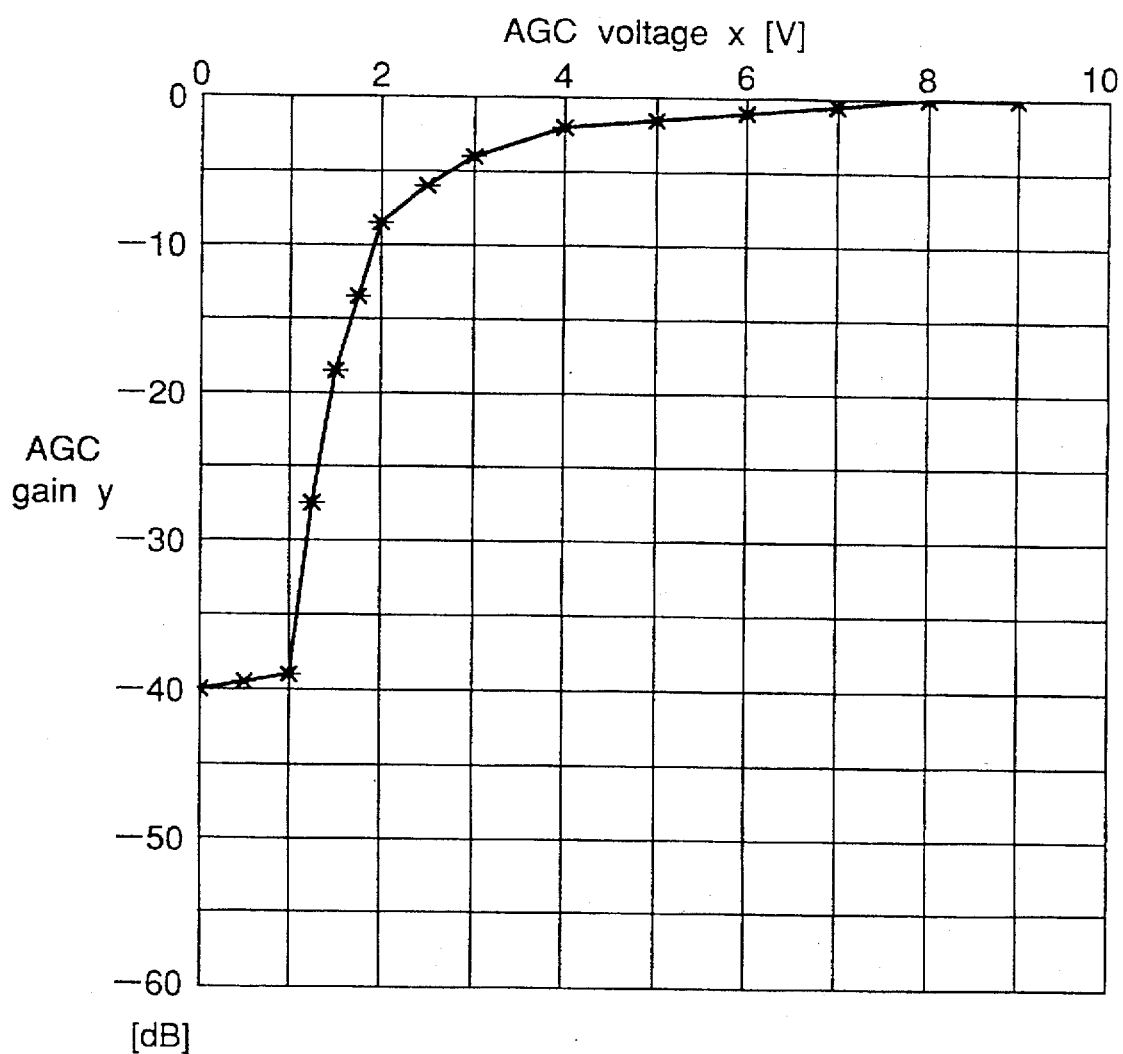
FIG. 2 is a graph of an AGC characteristic showing a curved AGC characteristic curve of a conventional AGC apparatus.

Therefore, in the first embodiment, in regard to the uncorrected AGC characteristic exhibiting a curved line shown in FIG. 2, the AGC voltage range was divided into a plurality of intervals, and the curved line was approximated to a straight line in each interval, thereby forming a plurality of linear approximation equations. Then, an inverse function of each of a plurality of functions representing the plurality of linear approximation equations is implemented in a circuit form by a linear correction circuit 6 as described hereinafter. Therefore, with the linear correction circuit 6, linearity of the AGC characteristic of the AGC apparatus having the above-mentioned arrangement is improved.

The above-mentioned arrangement will be described below more concretely.

The AGC voltage range is divided into n intervals (n is a positive integer), and the linear approximation equations of the AGC characteristic curve in the intervals are expressed by the following n Equations $(7)_1$, Equation $(7)_2$, Equation $(7)_i$, Equation $(7)_n$.

$$f_1(x) = c_1 x + d_1 \quad (7)_1$$

$$f_2(x) = c_2 x + d_2 \quad (7)_2$$

$$f_i(x) = c_i x + d_i \quad (7)_i$$

$$f_n(x) = c_n x + d_n \quad (7)_n$$

where $c_1, c_2, \ldots, c_n$ and $d_1, d_2, \ldots, d_n$ are constants.

Then, the inverse function $f^{-1}$ (ax+b) to be obtained is expressed by the following n Equations $(8)_1$, Equation $(8)_2$, $\ldots$, Equation $(8)_n$.

$$w = f^{-1}{}_1(ax+b) = k_1 x + l_1, \; k_1 = a/c_1, \; l_1 = b/c_1 - d_1 \quad (8)_1$$

$$w = f^{-1}{}_2(ax+b) = k_2 x + l_2, \; k_2 = a/c_2, \; l_2 = b/c_2 - d_2 \quad (8)_2$$

$$w = f^{-1}{}_i(ax+b) = k_i x + l_i, \; k_i = a/c_i, \; l_i = b/c_i - d_i \quad (8)_i$$

$$w = f^{-1}{}_n(ax+b) = k_n x + l_n, \; k_n = a/c_n, \; l_n = b/c_n - d_n \quad (8)_n$$

As apparent from Equations (8), in view of each interval, the correction function $f^{-1}$ is a linear equation having an inclination $k_i$ and an intercept $l_i$. Therefore, the linear correction circuit 6 for implementing the correction function $f^{-1}$ can be constituted by an operational amplifier having a gain and an offset voltage. The above-mentioned fact will be described as follows.

Figure 3:
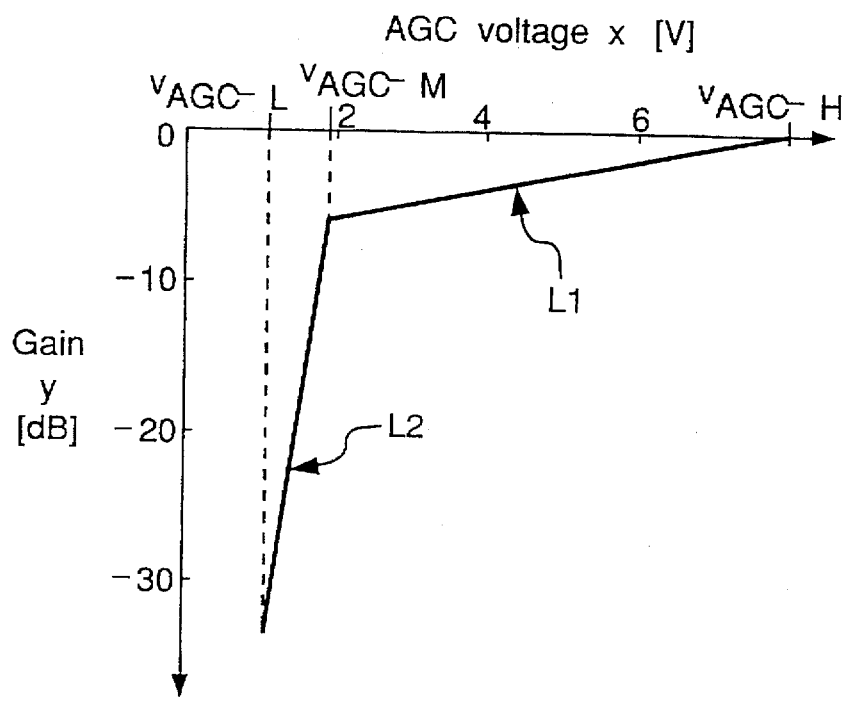
FIG. 3 is a graph showing a state in which the above curved AGC characteristic curve is approximated to two straight lines.

Here is considered a case where the AGC voltage range is divided into two intervals as a simplest example. The AGC curve of the AGC characteristic shown in FIG. 2 is approximated to two straight lines of a straight line L1 having a small inclination and a straight line L2 having a great inclination in a manner as shown in FIG. 3. In the present case, optimized correction equations to be obtained are expressed by the following Equation (9) and Equation (10). Equation (10) represents an inverse function of the straight line L2 for approximating in a region where the AGC voltage x is low, while Equation (9) represents an inverse function of the straight line L1 for approximating in a region where the AGC voltage x is high.

$$w = k_1 x + l_1 \quad [V_{AGC-M} < x < V_{AGC-H}] \quad (9)$$

$$w = k_2 x + l_2 \quad [V_{AGC-L} < x < V_{AGC-M}] \quad (10)$$

where $|k_1| > |k_2|$.

Figure 5:
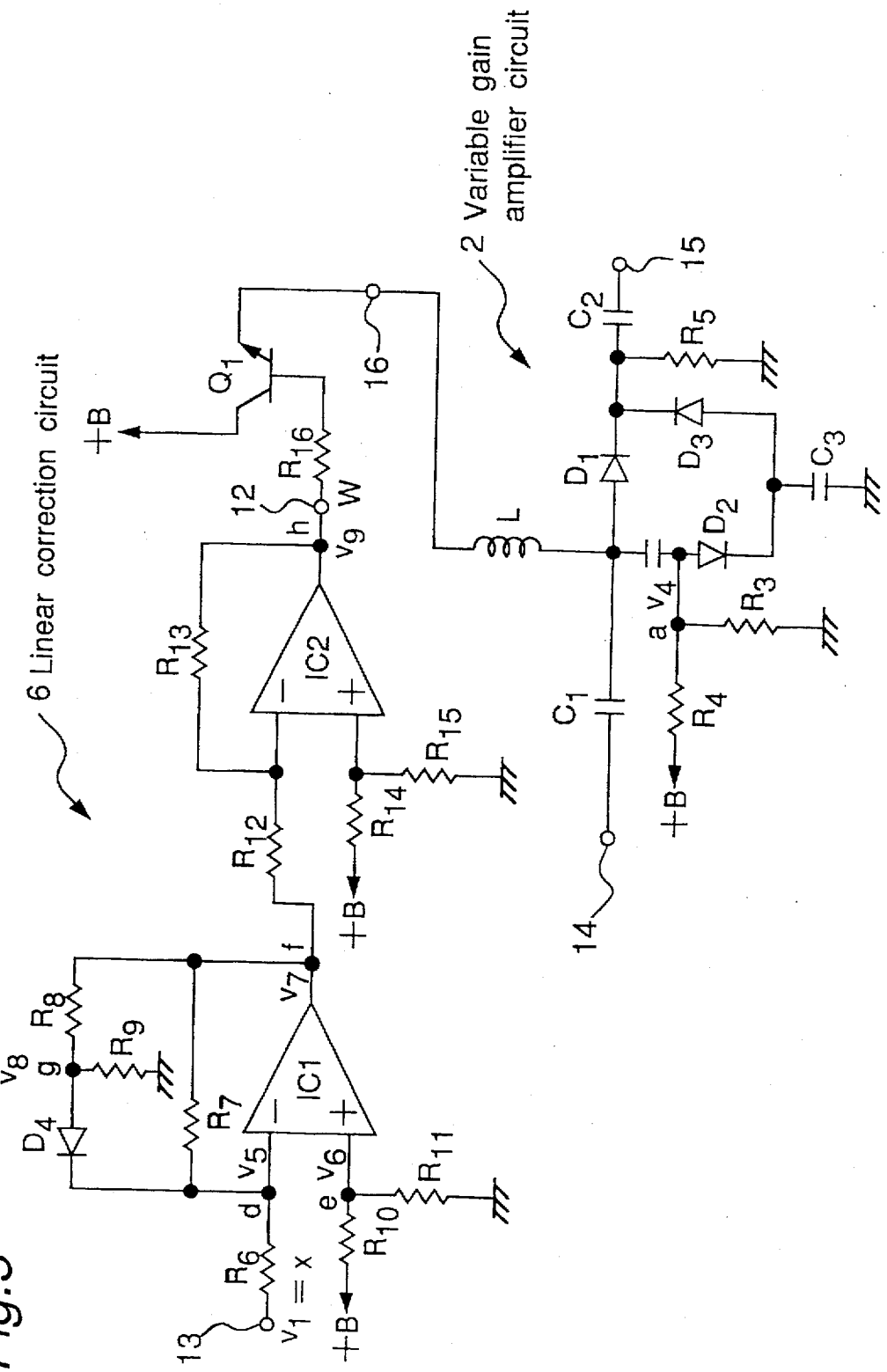
FIG. 5 is a circuit diagram of a linear correction circuit and a variable gain amplifier circuit of the first embodiment.

Next, FIG. 5 shows a construction of the linear correction circuit 6 for implementing the above-mentioned Correction Equations (9) and (10). The linear correction circuit 6 includes operational amplifiers IC1 and IC2. Across an output terminal and a negative (−) input terminal of the operational amplifier IC1 is connected a parallel circuit in which a series circuit of a resistor $R_8$ and a diode $D_4$ is connected in parallel with a resistor $R_7$. Further, a resistor $R_9$ is connected across the ground and a connection point g of the resistor $R_8$ and the diode $D_4$. Further, a resistor $R_6$ is connected between a connection point d of the negative (−) input terminal and the above-mentioned parallel circuit and the control voltage output terminal i.e. AGC voltage output terminal 13 of the control voltage generation circuit 7. Further, a resistor $R_{10}$ is connected between a positive (+) input terminal of the operational amplifier IC1 and a battery having a power voltage B. Further, a resistor $R_{11}$ is connected across the ground and a connection point e of the resistor $R_{10}$ and the positive (+) input terminal.

The output terminal of the operational amplifier IC1 is connected to a negative (−) input terminal of the operational amplifier IC2 via a resistor $R_{12}$. A resistor $R_{14}$ is connected between a positive (+) input terminal of the operational amplifier IC2 and the battery having the power voltage B. Further, a resistor $R_{15}$ is connected across the ground and the connection point of the resistor $R_{14}$ and the positive (+) input terminal. Further, a resistor $R_{13}$ is connected across a connection point of the resistor $R_{12}$ and the negative (−) input terminal and an output terminal of the operational amplifier IC2. Further, the output terminal of the operational amplifier IC2 is connected to a base of a current buffer transistor $Q_1$ via a resistor $R_{16}$. A collector of the current buffer transistor $Q_1$ is connected to the battery having the power voltage B, while an emitter thereof is connected to a tuner AGC voltage input terminal 16.

In the circuit shown in FIG. 5, the resistance values of the resistor $R_{10}$ and the resistor $R_{11}$ are set so that an output of the operational amplifier IC1 is saturated when the voltage $v_1$ applied to the control voltage generator circuit output terminal 13, i.e., an AGC voltage x prior to the correction process has its maximum value. The above-mentioned setting does not effect the AGC at the point where the AGC voltage is at its maximum even though the element characteristics vary to a certain extent.

When the voltage $v_1$ has its maximum value, an output level $v_7$ of the operational amplifier IC1 comes to have a minimum output level. Then, a voltage $v_8$ at the connection point g is a voltage obtained by dividing the voltage $v_7$ by the resistors $R_8$ and $R_9$, when the diode $D_4$ is turned off.

When the voltage $v_1$ is lowered, the operational amplifier IC1 enters into its operating area, and the voltage $v_7$ at a connection point f increases at an inclination depending on the resistor $R_6$ and the resistor $R_7$. When a voltage $v_5$ at the connection point d is greater than the voltage $v_8$, the diode $D_4$ remains off.

When the voltage $v_1$ is further lowered, the voltage $v_7$ at the connection point f increases, and the voltage $v_8$ at the connection point g also increases. When the voltage $v_8$ becomes greater than the voltage $v_5$, the diode $D_4$ is turned on. If an ON-state resistance of the diode $D_4$ is ignored here, a feedback resistance of the operational amplifier IC1 is achieved by a parallel resistance value of the resistor $R_8$ and the resistor $R_7$. That is, in consequence of turning-on of the diode $D_4$, the gain of the operational amplifier IC1 reduces. Therefore, a portion of increase of the control voltage w reduces with respect to a portion of increase of the voltage $v_1$, i.e., the AGC voltage x, and the inclination of the straight line in a w−x coordinate system reduces.

Therefore, by setting the resistor $R_6$, resistor $R_7$ and resistor $R_8$ so that they satisfy the equations of $|k_1|=R_7/R_6$ and $|k_2|=(R_7//R_8)/R_6$ in the amplifier including the operational amplifier IC1, an inverse function of the correction characteristic comprised of Equation (9) and Equation (10) can be obtained. In the present case, $(R_7//R_8)$ represents a resistance value achieved when the resistor $R_7$ and the resistor $R_8$ are connected in parallel with each other.

Figure 4:
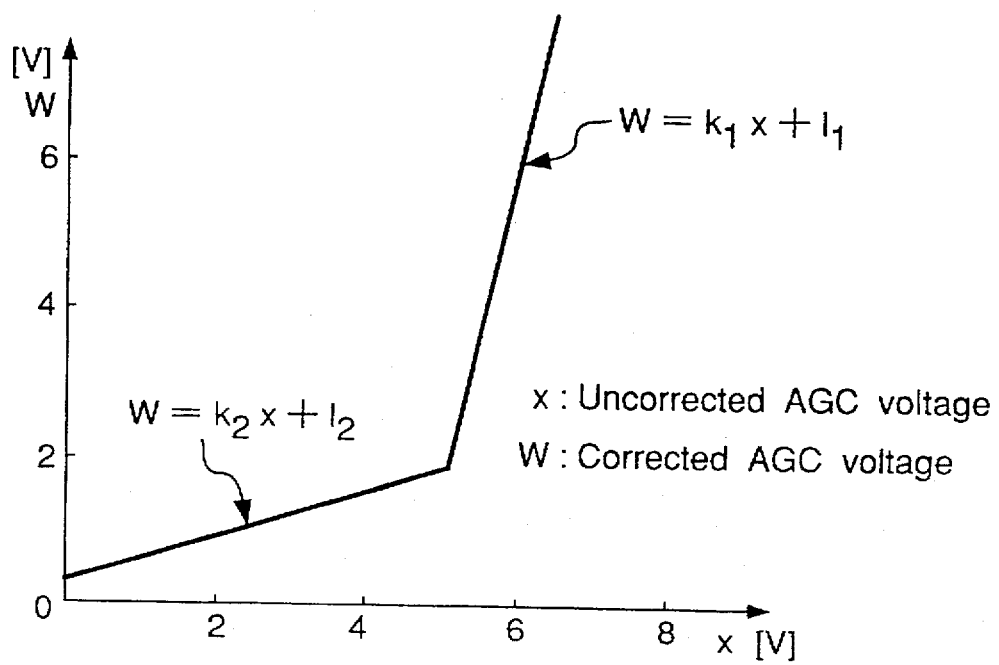
FIG. 4 is a graph showing a correction function for correcting the characteristic shown in FIG. 3.

Then, the output of the operational amplifier IC1 is inputted to a negative (−) input terminal of the operational amplifier IC2. Then, the operational amplifier IC2 functions as an inverting amplifier with the setting of resistor $R_{12}$= resistor $R_{13}$, an output $v_9$ of the operational amplifier IC2 can have the aforementioned correction characteristic, thereby allowing the correction characteristic shown in FIG. 4 to be obtained.

Figure 6:
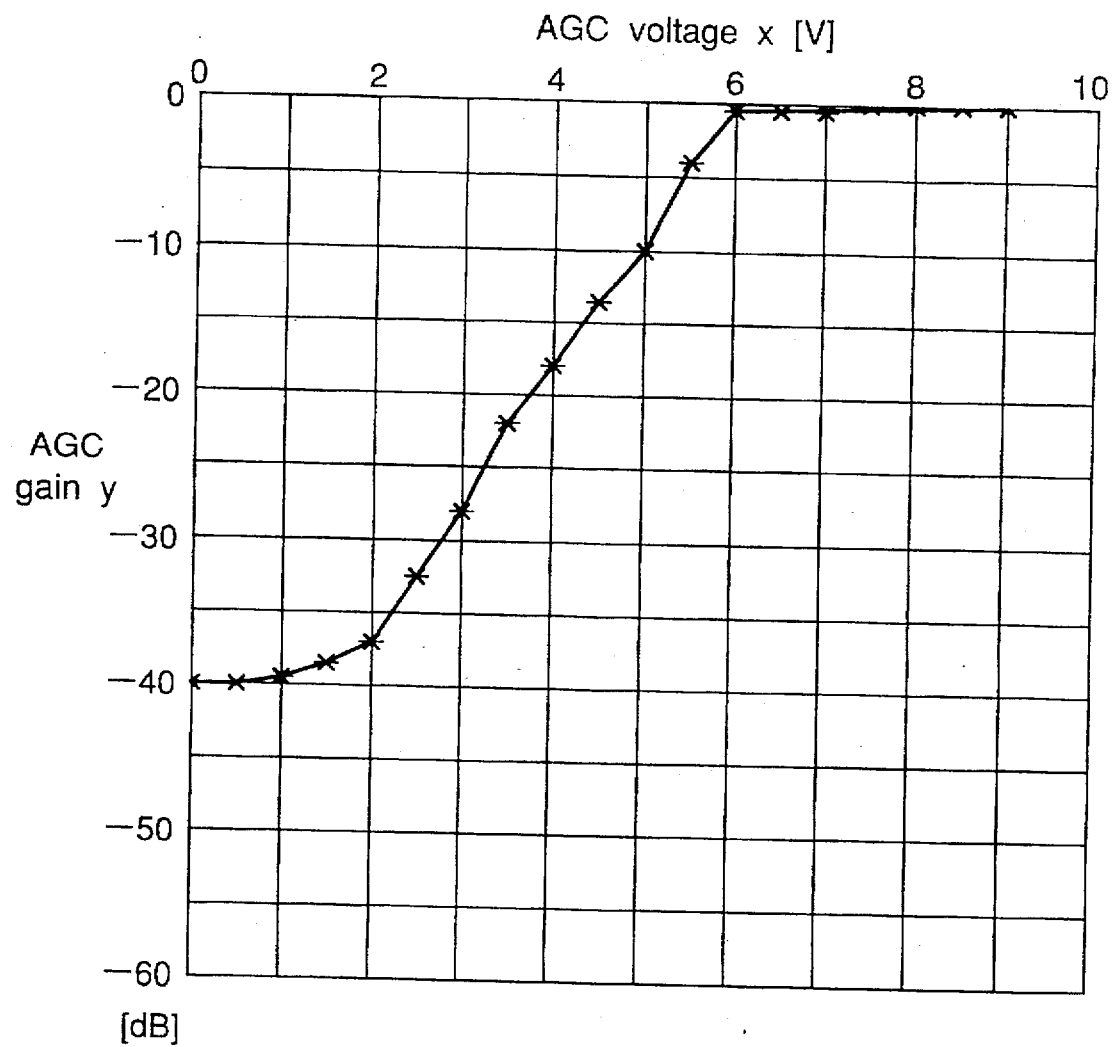
FIG. 6 is a graph showing a linearized AGC characteristic of the AGC apparatus of the first embodiment.

FIG. 6 shows a corrected AGC characteristic of the AGC apparatus of the first embodiment included in the CATV tuner 101 shown in FIG. 1. It can be found that the linearity of the present characteristic is improved in comparison with the uncorrected AGC characteristic shown in FIG. 2. According to the AGC characteristic of which linearity is improved, the AGC sensitivity is approximately constant at 0.1 V/1 dB when the AGC voltage x is within a range of 2 V to 6 V. Therefore, in order to control the gain in steps of 1 dB, it is required to vary the AGC voltage x in steps of 0.1 V. Therefore, the D/A converter 8 is required to achieve an output resolution of (10/0.1)+1=101 steps. Therefore, the D/A converter 8 is required to have a resolution of 7 bits, which is smaller than that of the conventional systems. Therefore, according to the present embodiment, cost of the D/A converter 8 can be reduced further than in the conventional systems.

Figure 11:
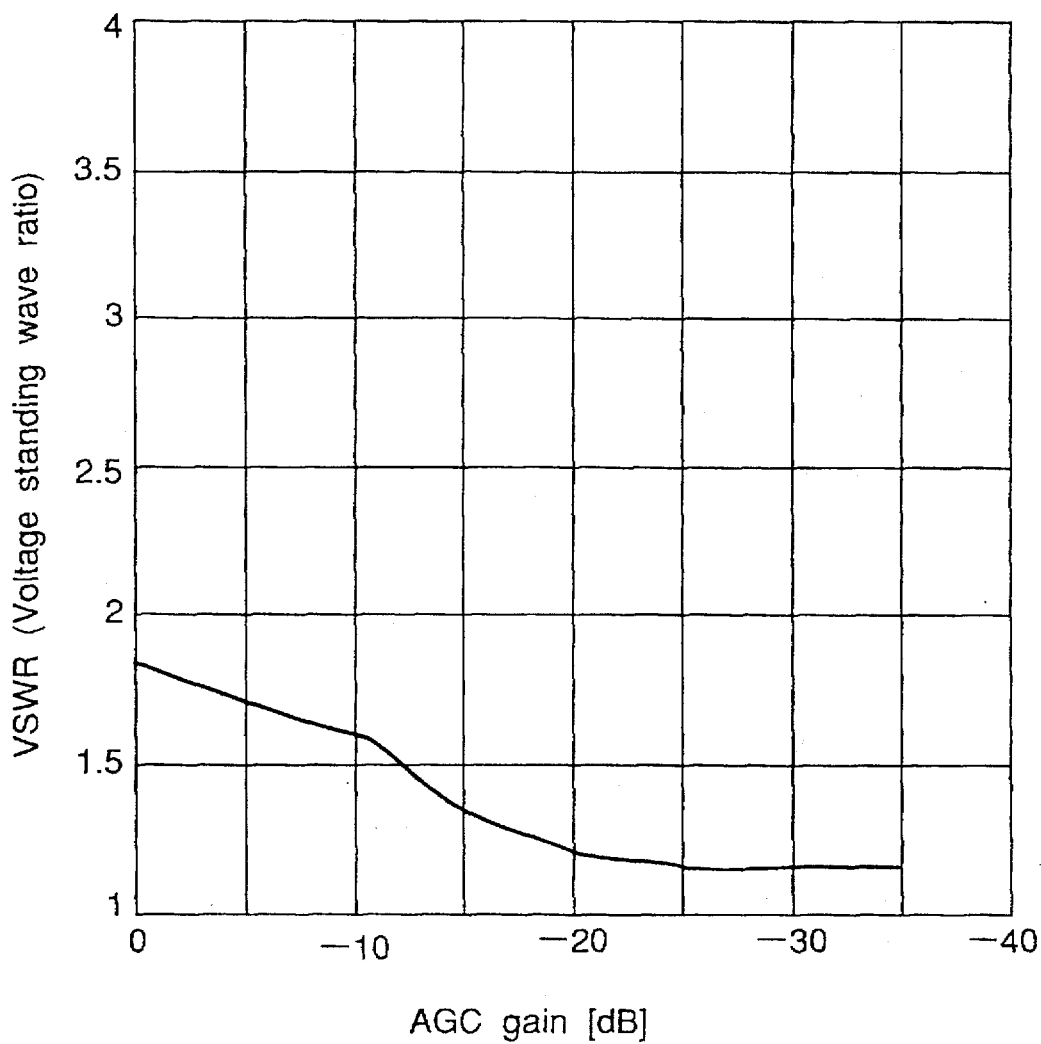
FIG. 11 is a graph of a characteristic showing a relation between a voltage standing wave ratio and an AGC gain at an input terminal of a tuner of the first embodiment of the present invention.

Further, FIG. 11 shows a characteristic of a relation between a VSWR (Voltage Standing Wave Ratio) at the input terminal 1 of the tuner 10 of the first embodiment and the AGC gain of the variable gain amplifier circuit 2. As apparent from the characteristic of the relation, the above-mentioned VSWR was able to be reduced below 2.0 in a range of 0 to 35 dB, thereby allowing the impedance matching condition to be improved. It is to be noted that, the closer the VSWR is to 1.0, the better the impedance matching condition is.

Therefore, according to the above-mentioned arrangement, the AGC characteristic of the variable gain amplifier circuit 2 can be linearized even when the variable gain amplifier circuit 2 is constructed so that sufficient impedance matching can be obtained at the terminal 14 of the variable gain amplifier circuit 2. Therefore, according to the above-mentioned arrangement, a sufficient impedance matching characteristic and a linear AGC characteristic can be concurrently satisfied.

Furthermore, according to the first embodiment, the non-linear AGC characteristic of the variable gain amplifier circuit 2 achieved when the AGC voltage x is inputted to the variable gain amplifier circuit 2 without undergoing any correction process is approximated to a plurality of straight lines, and the linear correction circuit 6 corrects the AGC voltage x with the inverse functions of the linear functions represented by the approximation straight lines. With the above-mentioned arrangement, the linear correction circuit 6 is allowed to correct the AGC voltage x with the inverse functions of the simple linear functions, and therefore the contents of correction can be simplified or made plain. Therefore, both impedance matching and linearization of the AGC characteristic can be achieved at low cost.

Furthermore, according to the present embodiment, the linear correction circuit 6 is comprised of the operational amplifier IC1 on which feedback is effected. With the above-mentioned arrangement, the AGC characteristic of the variable gain amplifier circuit 2 can be formed into a characteristic that is saturated at the maximum gain taking advantage of the saturation characteristic of the operational amplifier IC1 in a manner as shown in FIG. 6. Therefore, at and around the maximum gain, the AGC gain can be maintained at its maximum even when the AGC voltage x varies. According to the present saturation characteristic, the AGC gain can be surely maximized at and around the specified AGC voltage, and this facilitates easy designing of the AGC characteristic.

Figure 12:
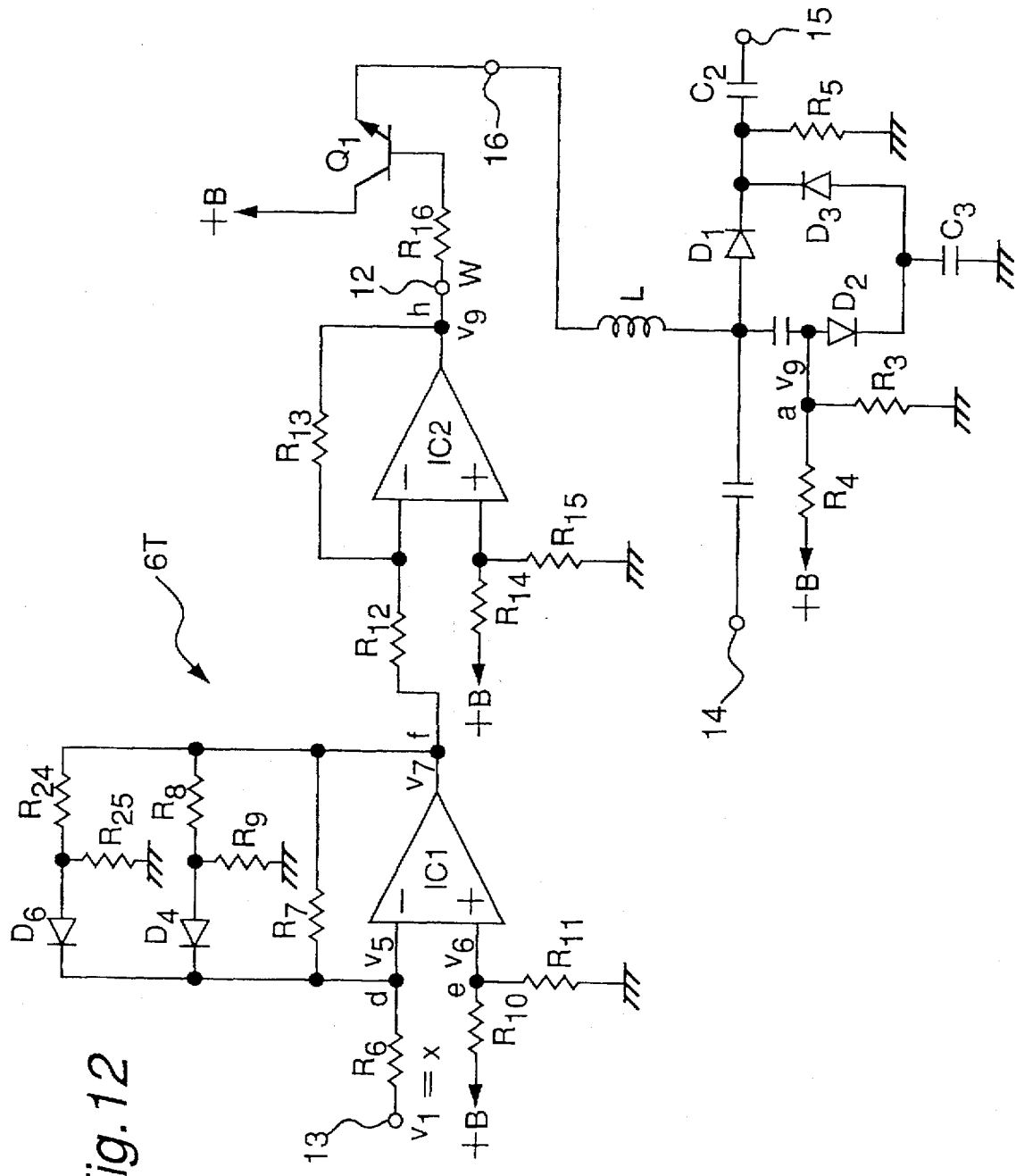
FIG. 12 is a circuit diagram of a linear correction circuit of an AGC apparatus according to a modification example of the first embodiment of the present invention.

In the above-mentioned first embodiment, the linear correction circuit 6 shown in FIG. 5 is constructed with the number n of intervals made two in Equation (7) and Equation (8). In contrast to the above, by connecting the other diode-resistor circuits which have the same construction as that of the diode-resistor circuit in the first stage comprised of the diode $D_4$ and the resistors $R_8$ and $R_9$ shown in FIG. 5 and have varied characteristic values of the components in parallel with the diode-resistor circuit in the first stage, the curve can be approximated to straight lines in n intervals of division, the number n being not smaller than three. Therefore, in the present case, an AGC characteristic having a superior linearity can be achieved. FIG. 12 shows a practical circuit construction of a linear correction circuit 6T in which the number n of intervals of division is made three. As shown in FIG. 12, the linear correction circuit 6T is a circuit in which a diode-resistor circuit in a second stage comprised of a diode $D_6$, a resistor $R_{24}$ and a resistor $R_{25}$ is connected in parallel with the diode-resistor circuit in the first stage comprised of the diode $D_4$, the resistor $R_8$ and the resistor $R_9$ of the linear correction circuit 6 of the first embodiment shown in FIG. 5.

Figure 13:
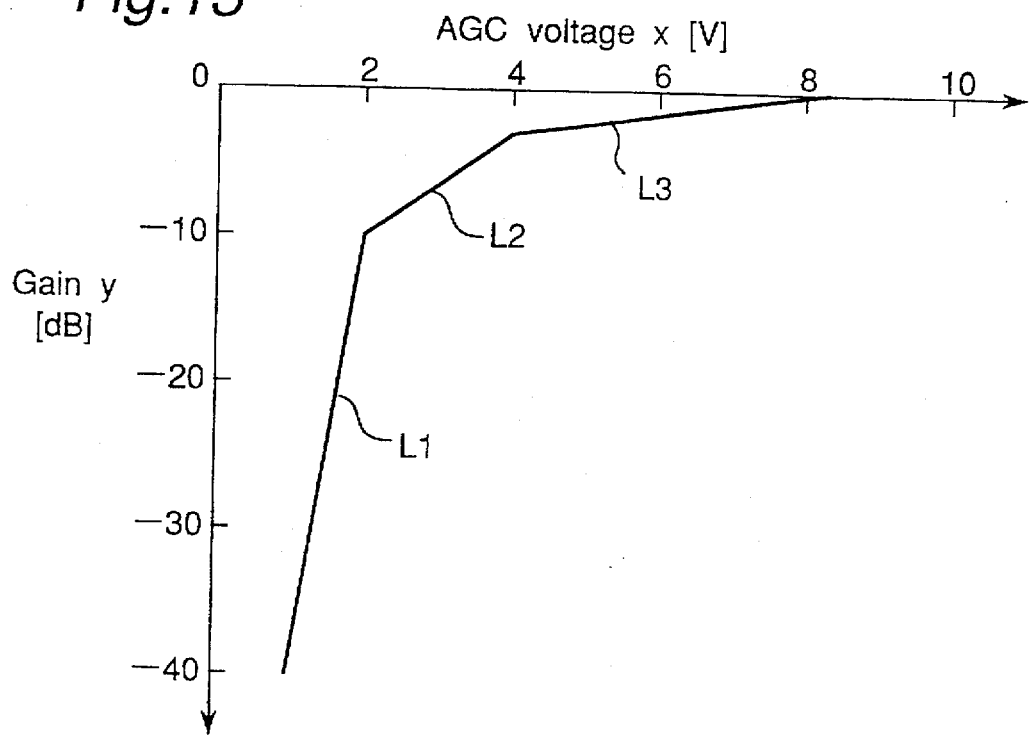
FIG. 13 is a graph of an AGC characteristic showing a state in which a curved AGC characteristic curve is approximated to three straight lines in the above modification example.
Figure 14:
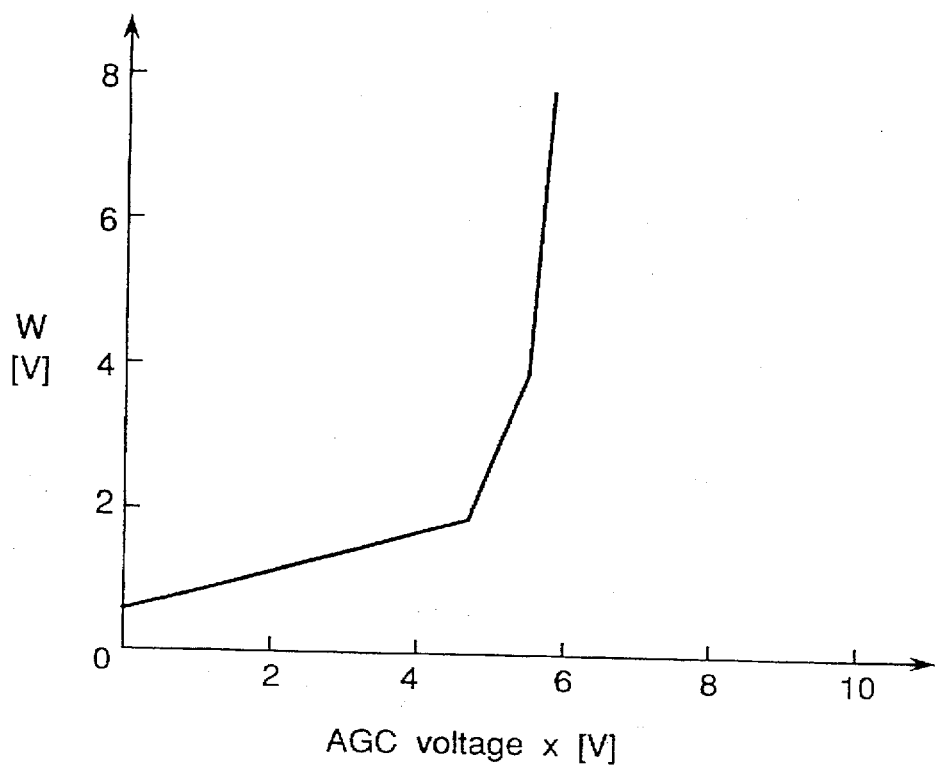
FIG. 14 is a graph showing a correction function for correcting the characteristic shown in FIG. 13 in the above modification example.

In the present case, the AGC characteristic shown in FIG. 2 is approximated to three straight lines L1, L2 and L3 in a manner as shown in FIG. 13, and inverse functions $f_1^{-1}, f_2^{-1}$ and $f_3^{-1}$ of the three straight lines L1, L2 and L3 are formed. Then, in a manner as shown in FIG. 14, it is appropriate to implement by the linear correction circuit 6T the above-mentioned three inverse functions which uses the AGC voltage x prior to the correction process as a variable and has the AGC voltage w obtained through the correction process as a function value. That is, the voltage at which the diode $D_6$ is turned on is set lower than the voltage at which the diode $D_4$ is turned on, so that the diodes $D_4$ and $D_6$ are successively made conductive according as the AGC voltage x is lowered. With the above-mentioned arrangement, the gain of the operational amplifier IC1 can be reduced in three steps according as the AGC voltage x is lowered. Therefore, the linear correction circuit 6T can correct the AGC voltage x prior to the correction process in a manner as shown in FIG. 14 and output the corrected AGC voltage w to the variable gain amplifier circuit 2. Therefore, the linear correction circuit 6T shown in FIG. 12 can correct the characteristic of the curved line shown in FIG. 2 through more correct approximation of the characteristic than that of the linear correction circuit 6 shown in FIG. 5. Therefore, according to the linear correction circuit 6T, the AGC characteristic can be approximated closer to a straight line than in the linear correction circuit 6.

Second Embodiment

Figure 10:
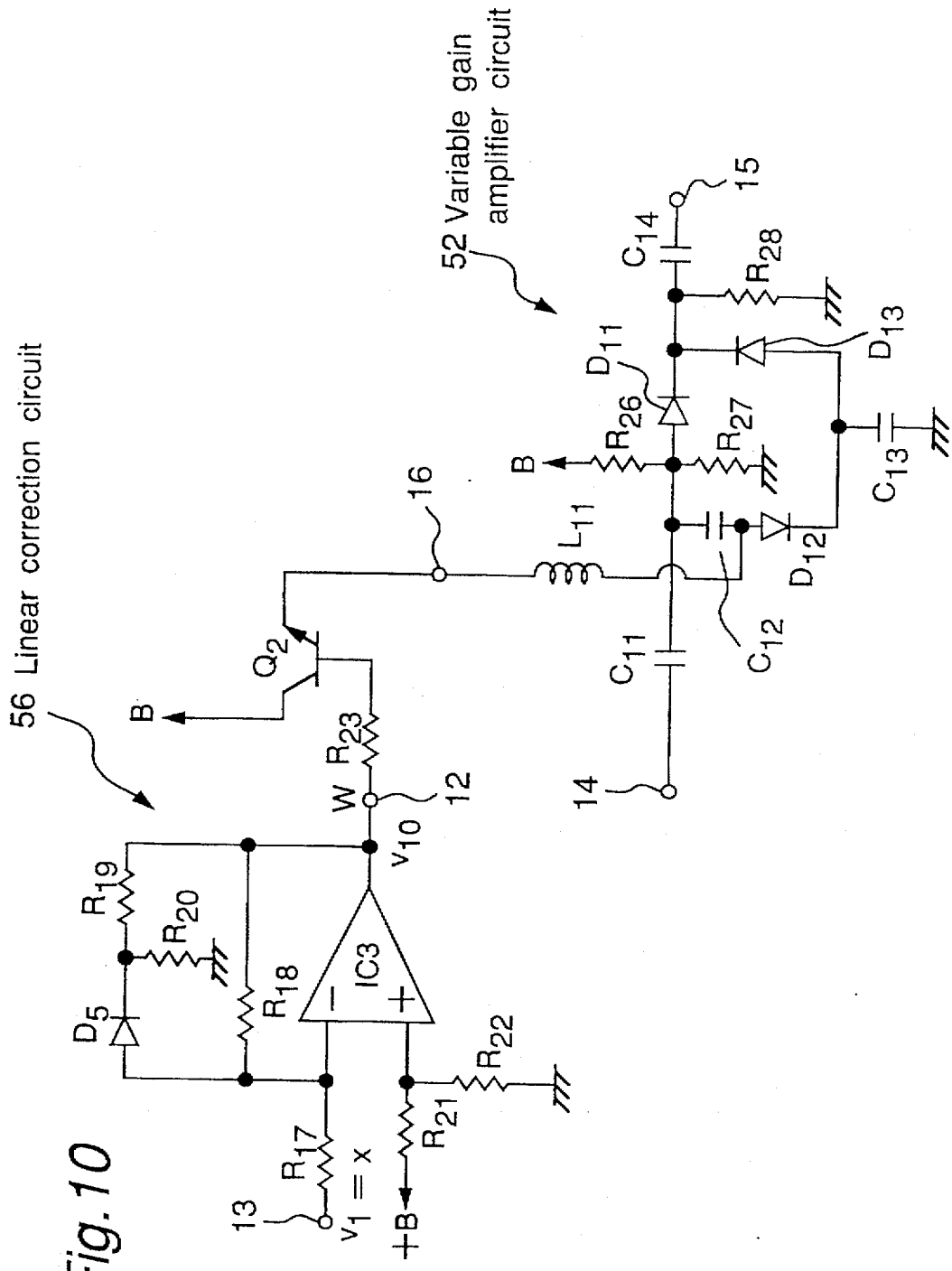
FIG. 10 is a circuit diagram of a linear correction circuit and a variable gain amplifier circuit of a second embodiment of the present invention.

Next, FIG. 10 shows a linear correction circuit 56 and a variable gain amplifier circuit 52 constituting an AGC apparatus according to a second embodiment of the present invention. A CATV tuner in which the AGC apparatus of the second embodiment is incorporated is provided with the variable gain amplifier circuit 52 and the linear correction circuit 56 in place of the variable gain amplifier circuit 2 and the linear correction circuit 6 of the CATV tuner 101 shown in FIG. 1.

As shown in FIG. 10, the AGC apparatus of the second embodiment includes the linear correction circuit 56 and the variable gain amplifier circuit 52. The linear correction circuit 56 includes an operational amplifier IC3. A parallel circuit in which a series circuit of a resistor $R_{19}$ and a diode $D_5$ is connected in parallel with a resistor $R_{18}$ is connected across an output terminal and a negative (−) input terminal of the operational amplifier IC3. Further, a resistor $R_{20}$ is connected across the ground and a connection point of the resistor $R_{19}$ and the diode $D_5$. Further, a resistor $R_{17}$ is connected between a connection point of the above-mentioned parallel circuit and the negative (−) input terminal and an AGC voltage generator circuit output terminal 13. Further, a resistor $R_{21}$ is connected between a positive (+) input terminal of the operational amplifier IC3 and a battery B. Further, a resistor $R_{22}$ is connected across the ground and a connection point of the resistor $R_{21}$ and the positive (+) input terminal.

The output terminal of the operational amplifier IC3 is connected to a base of a current buffer transistor $Q_2$ via a resistor $R_{23}$. A collector of the current buffer transistor $Q_2$ is connected to the battery B, while an emitter thereof is connected to an AGC voltage input terminal 16 in the variable gain amplifier circuit 52.

The variable gain amplifier circuit 52 includes three PIN diodes $D_{11}$, $D_{12}$ and $D_{13}$. The diode $D_{11}$ is connected to an input terminal 14 via a capacitor $C_{11}$ and to an output terminal 15 via a capacitor $C_{14}$. A resistor $R_{26}$ is connected across a connection point of the diode $D_{11}$ and the capacitor $C_{11}$ and the battery having a power voltage B. Further, a resistor $R_{27}$ is connected across the connection point and the ground. Further, a capacitor $C_{12}$ is connected to a lead wire which has the same electric potential and is extended from the above-mentioned connection point. The capacitor $C_{12}$ is connected in series with the diodes $D_{12}$ and $D_{13}$. The diode $D_{13}$ is connected to a connection wire line between the diode $D_{11}$ and the capacitor $C_{14}$. Further, an inductance $L_{11}$ is connected across a connection wire line between the capacitor $C_{12}$ and the diode $D_{12}$ and the input terminal 16 of control signal in the variable gain amplifier circuit 52. Further, a capacitor $C_{13}$ is connected across the ground and a connection wire line between the diodes $D_{12}$ and $D_{13}$. Further, a resistor $R_{28}$ is connected across the ground and a connection wire line between the diode $D_{11}$ and the capacitor $C_{14}$.

Figure 7:
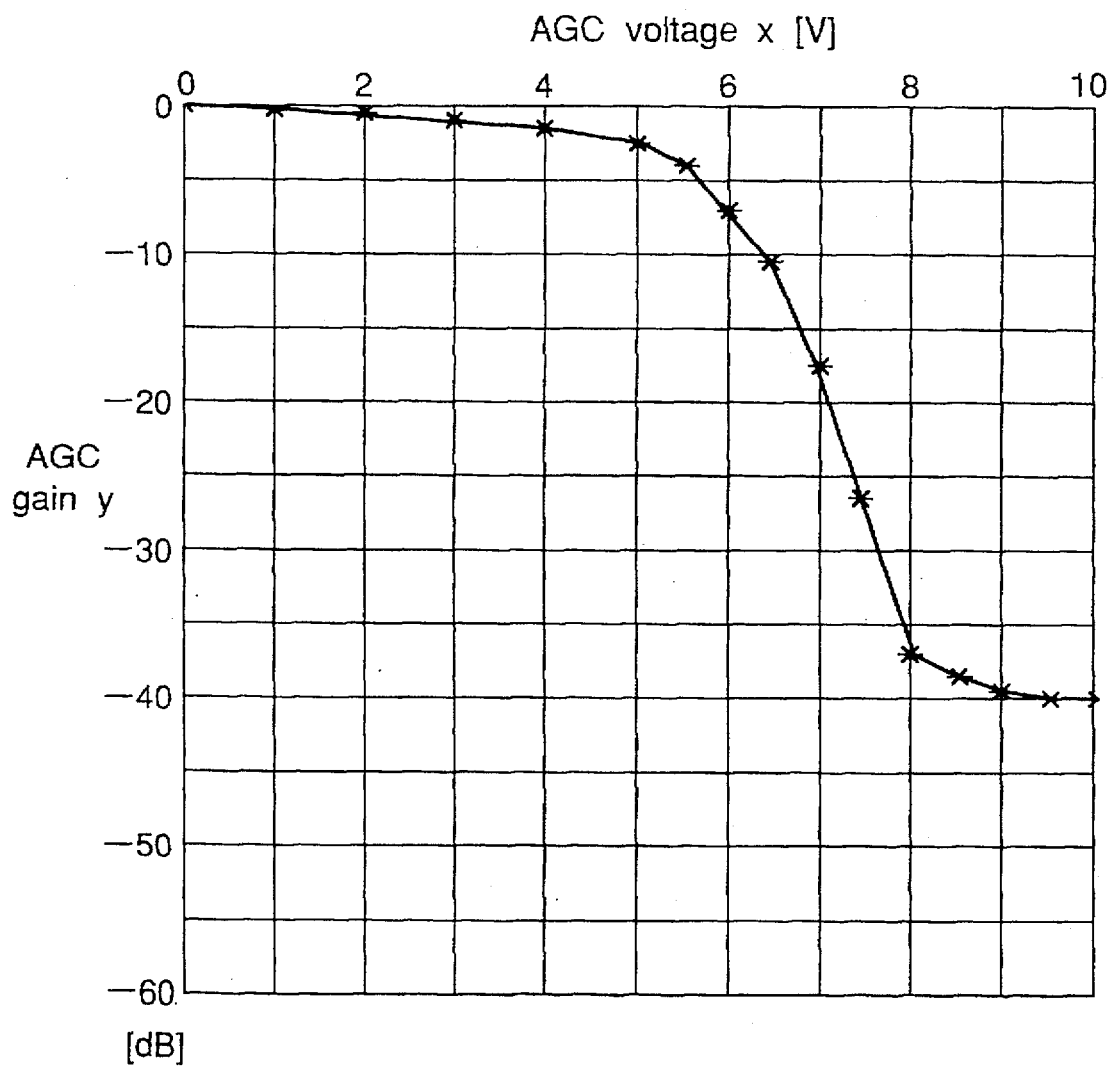
FIG. 7 is a graph showing a curved AGC characteristic of a forward variable gain amplifier circuit 52.

The variable gain amplifier circuit 52 of the tuner unit is a forward AGC type, and an attenuation value increases when the control voltage w inputted to the input terminal 12 is increased. FIG. 7 shows the AGC characteristic of the variable gain amplifier circuit 52 (including the current buffer transistor $Q_2$) when the AGC voltage x is not corrected in the correction circuit 56.

Figure 8:
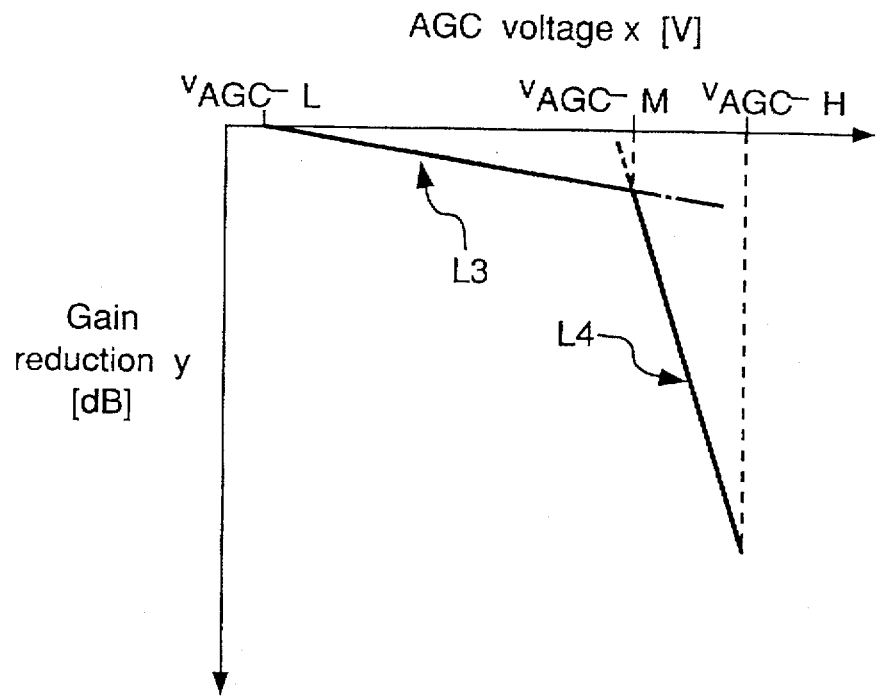
FIG. 8 is a graph showing a state in which the curved AGC characteristic shown in FIG. 7 is approximated to two straight lines.

In the second embodiment, a curve representing the uncorrected AGC characteristic as shown in FIG. 7 is approximated to two straight lines L3 and L4 as shown in FIG. 8 in the same manner as in the first embodiment. In the present case, optimized Correction Equations (11) and (12)

corresponding to Equations (9) and (10) of the first embodiment are obtained. The Correction Equation (11) is for correcting the straight line L3 having a small 5 inclination in an area where the AGC voltage x is low, meaning that the equation has a great inclination. Meanwhile, Correction Equation (12) is for correcting the straight line L4 having a great inclination in an area where the AGC voltage x is high, meaning that the equation has a small inclination.

$$w = p_1 x + q_1 [V_{AGC-L} < x < V_{AGC-M}] \tag{11}$$

$$w = p_2 x + q_2 [V_{AGC-M} < x < V_{AGC-H}] \tag{12}$$

where $|p_1| > |p_2|$.

Figure 9:
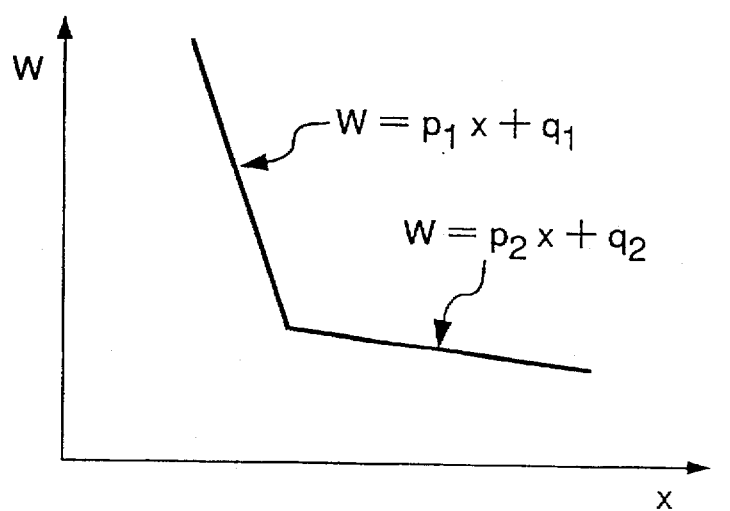
FIG. 9 is a graph showing a correction function for correcting the characteristic shown in FIG. 3.

The correction characteristic expressed by Correction Equations (11) and (12) is shown in FIG. 9.

When the attenuation value in the tuner variable gain amplifier circuit 52 is minimized with the voltage $v_1$ applied from the control voltage generator circuit 7 to the output terminal 13, i.e., the uncorrected AGC voltage x minimized in the circuit shown in FIG. 10, an output voltage $v_{10}$ of the operational amplifier IC3 comes to have a maximum saturation output level of the operational amplifier IC3. Therefore, the diode $D_5$ is turned off. Subsequently, when the above-mentioned voltage $v_1$ (uncorrected AGC voltage x) is increased, the operational amplifier IC3 enters into its operating area. In this stage, in the operating area where the diode $D_5$ is turned off, the output voltage $v_{10}$ of the operational amplifier IC3 lowers at an inclination of $|p_1| = (R_{18}/R_{17})$. The characteristic corresponds to the straight line portion having a steep inclination shown in FIG. 9.

Subsequently, when the voltage $v_1$ further increases with lowering of the voltage $v_{10}$, the diode $D_5$ is turned on. Consequently, the inclination of the output voltage characteristic of the operational amplifier IC3 reduces to have an inclination of $|p_2| = (R_{18}//R_{19})/R_{17}$. The characteristic corresponds to the straight line portion having a gradual inclination shown in FIG. 9. It is to be noted that $(R_{18}//R_{19})$ represents a resistance value achieved when the resistor $R_{18}$ and the resistor $R_{19}$ are connected in parallel with each other.

Thus the linear correction circuit 56 of the second embodiment can correct the curved uncorrected AGC characteristic curve shown in FIG. 7 by the inversely bent correction characteristic shown in FIG. 9 of the bent AGC characteristic shown in FIG. 8 obtained through approximation of the curve to straight lines in two intervals, thereby allowing a linear AGC characteristic to be achieved.

Therefore, according to the AGC apparatus of the second embodiment, a linear AGC characteristic can be achieved at low cost while allowing the variable gain amplifier circuit 52 to have a sufficient impedance matching characteristic.

Also, in the linear correction circuit 56 of the AGC apparatus of the second embodiment, by connecting in n stages other diode-resistor circuits which have the same construction as that of the diode-resistor circuit in the first stage comprised of the diode $D_5$ and the resistors and $R_{20}$ shown in FIG. 10 and have varied characteristic values of the components in parallel with the diode-resistor circuit in the first stage, the curve can be approximated to straight lines in n intervals of division, the number n being not smaller than three. Therefore, in the present case, an AGC characteristic having a superior linearity can be achieved.

Furthermore, when the linear correction circuit 6 or 56 is integrated with the tuner unit 10, the variable gain amplifier circuit 2 and the linear correction circuit 6 or 56 of the AGC apparatus can be handled as an integrated object. Therefore, improved handling can be achieved in the processes of adjustment, assembling and so forth.

Furthermore, the variable gain amplifier circuits 2 and 52 are each comprised of PIN diodes in the first and second embodiments, however, they may be each comprised of transistors.

As apparent from the above description, the AGC apparatus of the present invention comprises a variable gain amplifier for adjusting a gain of an analog output signal with respect to, an analog input signal according to a level of an analog control signal; a signal processor for receiving the analog output signal of the variable gain amplifier and outputting a digital signal; a D/A convertor for receiving the digital signal outputted from the signal processor and outputting an analog signal; and a linear correction circuit for receiving the analog signal outputted from the D/A converter and outputting a corrected signal obtained by correcting the analog signal as the analog control signal to the variable gain amplifier so that a relation of the gain of the variable gain amplifier with respect to the analog signal is expressed by at least one straight line.

Therefore, according to the AGC apparatus of the present invention, the linear correction circuit linearizes the AGC characteristic of the variable gain amplifier circuit by using the corrected signal formed by correcting the analog signal outputted from the D/A converter as the control signal. Therefore, the AGC characteristic of the variable gain amplifier circuit can be linearized even when the variable gain amplifier circuit is constructed so that sufficient impedance matching can be achieved at the input terminal of the variable gain amplifier circuit. Therefore, according to the AGC apparatus of the present invention, a sufficient impedance matching characteristic and a linear AGC characteristic can be concurrently satisfied.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An AGC apparatus comprising:
    variable gain amplification means for amplifying an analog input signal with a gain according to a level of an analog control signal to provide an analog output signal;
    signal processing means for receiving the analog output signal of said variable gain amplification means and outputting a digital signal;
    D/A conversion means for receiving the digital signal outputted from said signal processing means and outputting an analog signal; and
    linear correction means, coupled to receive the analog signal outputted from said D/A conversion means, for correcting the analog signal and outputting the corrected analog signal to said variable gain amplification means as the analog control signal so that a relation of the gain of said variable gain amplification means with respect to the analog signal is expressed by at least one straight line.

2. The AGC apparatus as claimed in claim 1, wherein if the analog signal outputted from said D/A conversion means is inputted as the analog control signal to said variable gain amplification means without being corrected, and if a characteristic curve representing the relation of the gain of said variable gain amplification means with respect to the analog control signal is expressed by two linear functions $y = f_1(x) = c_1 x + d_1$ and $y = f_2(x) = c_2 x + d_2$, wherein an x-coordinate value of an intersection of $y = f_1(x)$ and $y = f_2(x)$ is t such that $y=f_1(x)$ is used when $x \leq t$ and $y=f_2(x)$ is used when $x>t$, where x represents a voltage and y represents a gain, said linear correction means determines a value w of $w=f_1^{-1}(ax+b)$ and $w=f_2^{-1}(ax+b)$ as the corrected analog signal using a linear function (ax+b) of the analog signal x prior to a correction process as a variable x of inverse functions $f_1^{-1}(x)$ and $f_2^{-1}(x)$ of $f_1(x)$ and $f_2(x)$.

3. The AGC apparatus as claimed in claim 1, wherein said variable gain amplification means and said linear correction means are provided in a tuner main unit of a tuner comprised of the tuner main unit and a digital demodulator unit.

4. The AGC apparatus as claimed in claim 1, wherein said linear correction means comprises an operational amplifier on which negative feedback is effected, the analog output signal being saturated by said operational amplifier when the analog input signal has a level greater than a specified level.

5. The AGC apparatus as claimed in claim 1, wherein said signal processing means comprises:
- an A/D converter, coupled to said variable gain amplification means, for digitally converting the analog output signal into a converted digital signal; and
- a digital demodulator coupled to said A/D converter, for processing the converted digital signal for digital demodulation to output the digital signal.

6. The AGC apparatus as claimed in claim 1, wherein said D/A conversion means comprises:
- a D/A converter which receives the digital signal and outputs a converted analog signal; and
- a control voltage generator circuit which outputs a control voltage signal to said linear correction means as the analog signal according to the converted analog signal from said D/A converter.

7. The AGC apparatus as claimed in claim 1, wherein said variable gain amplification means comprises a plurality of PIN diodes.

8. The AGC apparatus as claimed in claim 1, further comprising level detection means for outputting a level detection signal representing a level of the digital signal outputted from said signal processing means to said D/A conversion means as the digital signal.

9. A method of automatic gain control comprising the steps of:
a) amplifying an analog input signal with a gain according to a level of an analog control signal to provide an analog output signal;
b) processing the analog output signal to provide a processed digital signal;
c) converting the processed digital signal into an analog signal; and
d) correcting the analog signal and providing the corrected analog signal as the analog control signal so that a relation of the gain in said step a) with respect to the analog signal is expressed by at least one straight line.

10. The method of automatic gain control of claim 9, wherein if the analog signal is provided as the analog control signal in said step a) without being corrected, and if a characteristic curve representing the relation of the gain in said step a) with respect to the analog control signal is expressed by two linear functions $y=f_1(x)=c_1x+d_1$ and $y=f_2(x)=c_2x+d_2$, wherein an x-coordinate value of an intersection of $y=f_1(x)$ and $y=f_2(x)$ is t such that $y=f_1(x)$ is used when $x \leq t$ and $y=f_2(x)$ is used when $x>t$, where x represents a voltage and y represents a gain, said step d) determines a value w of $w=f_1^{-1}(ax+b)$ and $w=f_2^{-1}(ax+b)$ as the corrected analog signal using a linear function (ax+b) of the analog signal x prior to a correction process as a variable x of inverse functions $f_1^{-1}(x)$ and $f_2^{-1}(x)$ of $f_1(x)$ and $f_2(x)$.

11. The method of automatic gain control of claim 9, wherein said step d) comprises saturating the analog output signal using an operational amplifier having negative feedback when the analog input signal has a level greater than a specified level.

12. The method of automatic gain control of claim 9, wherein said step b) comprises:
b1) digitally converting the analog output signal into a converted digital signal; and
b2) processing the converted digital signal for digital demodulation to output the processed digital signal.

13. The method of automatic gain control of claim 9, wherein said step c) of converting comprises:
c1) converting the processed digital signal into a converted analog signal; and
c2) generating a control voltage signal as the analog signal according to the converted analog signal.

14. The method of automatic gain control of claim 9, wherein said step a) comprises amplifying the analog input signal with a plurality of PIN diodes.

15. The method of automatic gain control of claim 9, further comprising step e) of generating a level detection signal representing a level of the processed digital signal of said step b) and providing the level detection signal as the processed digital signal of said step c).

16. An AGC apparatus comprising:
- variable gain amplification means for amplifying an analog input signal with a gain in accordance with an analog control signal to provide an amplified signal;
- processing means, coupled to said variable gain amplification means, for processing the amplified signal into a processed digital signal and converting the processed digital signal into an analog signal; and
- linear correction means, coupled to said processing means, for dividing a non-linear gain characteristic of said variable gain amplification means into a plurality of intervals represented by respective linear approximation functions, generating respective inverse functions of the linear approximation functions and providing the analog control signal in accordance with the inverse functions and the analog signal.

17. The AGC apparatus of claim 16, wherein said linear correction means divides the non-linear gain characteristic into at least one interval such that a relation of the gain of said variable gain amplification means with respect to the analog signal is expressed by at least one straight line.

18. A method of automatic gain control comprising the steps of:
a) amplifying an analog input signal with a gain in accordance with an analog control signal to provide an amplified signal;
b) processing the amplified signal into a processed digital signal and converting the processed digital signal into an analog signal;
c) dividing a non-linear gain characteristic of the gain of said step a) into a plurality of intervals represented by respective linear approximation functions;
d) generating respective inverse functions of the linear approximation functions; and
e) providing the analog control signal in accordance with the inverse functions and the analog signal.

19. The method of automatic gain control of claim 18, wherein said step c) comprises dividing the non-linear gain characteristic into at least one interval such that a relation of the gain with respect to the analog signal is expressed by at least one straight line.

* * * * *